(12) United States Patent
Omori et al.

(10) Patent No.: US 12,020,958 B2
(45) Date of Patent: Jun. 25, 2024

(54) LIGHT IRRADIATION TYPE HEAT TREATMENT METHOD

(71) Applicant: SCREEN Holdings Co., Ltd., Kyoto (JP)

(72) Inventors: Mao Omori, Kyoto (JP); Kazuhiko Fuse, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 333 days.

(21) Appl. No.: 17/167,217

(22) Filed: Feb. 4, 2021

(65) Prior Publication Data

US 2021/0272823 A1    Sep. 2, 2021

(30) Foreign Application Priority Data

Feb. 28, 2020  (JP) .................................. 2020-033003
Mar. 23, 2020  (JP) .................................. 2020-050798

(51) Int. Cl.
*H01L 21/66*  (2006.01)
*H01L 21/67*  (2006.01)

(52) U.S. Cl.
CPC .. *H01L 21/67115* (2013.01); *H01L 21/67248* (2013.01); *H01L 22/12* (2013.01)

(58) Field of Classification Search
CPC ... H01L 22/12; H01L 22/20; H01L 21/67114; H01L 21/67248
See application file for complete search history.

(56) References Cited

U.S. PATENT DOCUMENTS 9,922,889 B2 * 3/2018 Ono ................... H01L 21/67115
2011/0259862 A1 * 10/2011 Scott ....................... B33Y 30/00
219/121.73
(Continued)

FOREIGN PATENT DOCUMENTS

JP    H08-37158 A    2/1996
JP    2017-017275 A    1/2017
(Continued)

OTHER PUBLICATIONS

Korean Notice of Decision to Grant dated Jun. 13, 2022 in corresponding Korean Patent Application No. 10-2021-0026369.
(Continued)

*Primary Examiner* — Yara B Green
*Assistant Examiner* — Fakeha Sehar
(74) *Attorney, Agent, or Firm* — OSTROLENK FABER LLP

(57) ABSTRACT

A preceding wafer is transported from a chamber of a heat treatment apparatus after processing on the preceding wafer is completed. A temperature within the chamber at a time when the preceding wafer is transported from the chamber is defined as a transportation temperature, and a difference between a measurement temperature within the chamber measured after the preceding wafer is transported from the chamber and the transportation temperature is calculated as a decreasing temperature. The calculated decreasing temperature and a predetermined threshold value are compared with each other. When the decreasing temperature is larger than the threshold value, dummy processing of preheating an in-chamber structure such as a susceptor by light irradiation from halogen lamps and flash lamps is executed. In contrast, when the decreasing temperature is equal to or smaller than the threshold value, the dummy processing is
(Continued)

not executed but processing on a subsequent substrate is started.

7 Claims, 12 Drawing Sheets

(56) References Cited

U.S. PATENT DOCUMENTS

| 2017/0011923 A1 | 1/2017 | Tanimura |
| 2017/0125312 A1 | 5/2017 | Ono |
| 2017/0194220 A1* | 7/2017 | Lieberer ............... H01L 21/324 |
| 2018/0144956 A1* | 5/2018 | Takaoka ............ H01L 21/67098 |
| 2018/0254224 A1 | 9/2018 | Kitazawa et al. |
| 2018/0261477 A1 | 9/2018 | Ito |
| 2018/0358234 A1 | 12/2018 | Ono |
| 2019/0393054 A1 | 12/2019 | Ono |
| 2020/0075344 A1 | 3/2020 | Omori et al. |
| 2021/0013059 A1 | 1/2021 | Fukatsu et al. |

FOREIGN PATENT DOCUMENTS

| JP | 2017-092102 A | 5/2017 |
| JP | 2018-148201 A | 9/2018 |
| JP | 2018-535542 A | 11/2018 |
| JP | 2018-207067 A | 12/2018 |
| JP | 2019-160905 A | 9/2019 |
| JP | 2019-220565 A | 12/2019 |
| JP | 2020-035811 A | 3/2020 |
| KR | 10-2018-0030231 A | 3/2018 |
| KR | 10-2018-0103702 A | 9/2018 |
| KR | 10-2018-0134769 A | 12/2018 |
| KR | 10-2019-0143389 A | 12/2019 |
| WO | WO 2017/116685 A1 | 7/2017 |

OTHER PUBLICATIONS

Notice of Reasons for Refusal dated Oct. 24, 2023 in corresponding Japanese Patent Application No. 2020-033003 and a computer generated English language translation obtained from the JPO.
Notice of Reasons for Refusal dated Oct. 3, 2023 in corresponding Japanese Patent Application No. 2020-050798 and computer generated English language translation obtained from the JPO.

* cited by examiner

F I G. 1 0
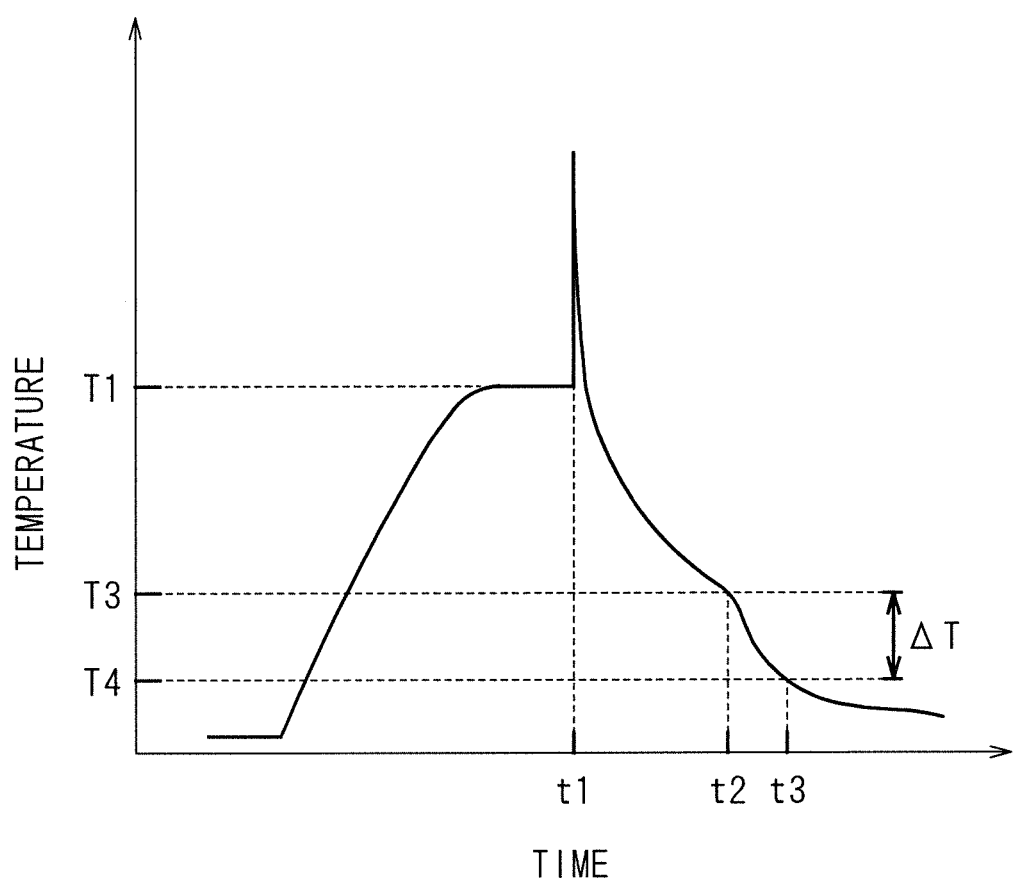

LIGHT IRRADIATION TYPE HEAT TREATMENT METHOD

BACKGROUND OF THE INVENTION

Field of the Invention

The present invention relates to a heat treatment method that irradiates a thin plate-like precision electronic substrate (hereinafter referred to simply as a "substrate") such as a semiconductor wafer with light to heat the substrate.

Description of the Background Art

A flash lamp anneal (FLA) which heats a semiconductor wafer for an extremely short time in a process of manufacturing a semiconductor device attracts attention. The flash lamp anneal is a heat treatment technique of irradiating a surface of a semiconductor wafer with a flash of light using a xenon flash lamp (a simple term of "a flash lamp" means a xenon flash lamp hereinafter), thereby increasing a temperature of only the surface of the semiconductor wafer in an extremely short time (several milliseconds or less).

A radiation spectral distribution of the xenon flash lamp ranges from an ultraviolet region to a near-infrared region, thus a wavelength of the xenon flash lamp is shorter than that of a conventional halogen lamp, and almost coincides with a basic absorption band of a silicon semiconductor wafer. Thus, when the semiconductor wafer is irradiated with a flash of light emitted from the xenon flash lamp, the temperature of the semiconductor wafer can be rapidly increased with less transmitted light. It is also known that a flash light emission for the extremely short time of several milliseconds or less can selectively increase a temperature of only a region near the surface of the semiconductor wafer.

Such a flash lamp anneal is used for processing requiring a heating for an extremely short time, for example, typically an activation of impurity implanted into the semiconductor wafer. When the surface of the semiconductor wafer into which the impurity is implanted by an ion implantation method is irradiated with a flash of light from the flash lamp, the surface of the semiconductor wafer can be increased to an activation temperature only for the extremely short time, thus only an impurity activation can be executed without deeply diffusing the impurity.

Not only the heat treatment but also any processing on a semiconductor wafer is typically performed in a unit of lot (one group of semiconductor wafer subjected to the same processing under the same condition). In a substrate processing device performing processing on a semiconductor wafer one by one, the processing is continuously performed in series on a plurality of semiconductor wafers constituting a lot. Also in a flash lamp annealer, a plurality of semiconductor wafers constituting a lot are transported into a chamber one by one and a heat treatment is performed in series.

However, a temperature of an in-chamber structure such as a susceptor holding the semiconductor wafer changes in some cases in a process of processing the plurality of semiconductor wafers constituting the lot in series. Such a phenomenon occurs in a case where processing is newly started in a flash lamp annealer which has been a non-operation state for a while or a case where a processing condition such as a processing temperature of a semiconductor wafer is changed. When the temperature of the in-chamber structure such as the susceptor changes in the process of processing the plurality of semiconductor wafers in the lot, there is a problem that a temperature history in the processing differs between the semiconductor wafer early in the lot and the late semiconductor wafer.

Performed to solve such a problem is that a dummy wafer which is not to be processed is transported into a chamber and supported by a susceptor before processing on product wafers constituting a lot is started, and a heat treatment is performed in the same conditions as that of the lot to be processed to increase a temperature of an in-chamber structure such as a susceptor to a stable temperature in advance (dummy running). US2017/0125312 discloses that the heat treatment is performed on around ten dummy wafers to make a temperature of an in-chamber structure such as a susceptor reach a stable temperature in processing.

The dummy running performed by consuming the plurality of dummy wafers before processing the product wafers which become products increases a running cost and also causes reduction in production efficiency. Thus, strongly required is reduction of the number of dummy wafers consumed in the dummy running as much as possible to reduce a time for the dummy running.

SUMMARY OF THE INVENTION

The present invention is intended for a heat treatment method of heating a substrate by irradiating the substrate with light.

According to one aspect of the present invention, a heat treatment method includes: a step (a) of measuring a temperature within a chamber after processing on a preceding substrate is finished and the preceding substrate is transported from the chamber; a step (b) of calculating a decreasing temperature which is a difference between a transportation temperature, which is a temperature within the chamber when the preceding substrate is transported from the chamber, and a measurement temperature measured in the step (a); and a step (c) of comparing the decreasing temperature calculated in the step (b) with a predetermined threshold value, wherein when the decreasing temperature is larger than the threshold value, dummy processing of preheating a structure within the chamber by light irradiation from continuous lighting lamps and flash lamps is executed, and when the decreasing temperature is equal to or smaller than the threshold value, the dummy processing is not executed but a subsequent substrate is transported into the chamber to start processing on the subsequent substrate.

When the decreasing temperature is relatively small, the dummy processing is not performed, thus the number of the consumed dummy wafers can be reduced.

It is preferable that in the dummy processing, the dummy wafer is not transported into the chamber, but the structure within the chamber is irradiated with light from the continuous lighting lamps and the flash lamps to preheat the structure within the chamber.

The dummy processing is executed without using the dummy wafer, thus the number of consumed dummy wafers can be reduced.

According to another aspect of the present invention, the heat treatment method includes: a step (a) of transporting a plurality of dummy wafers into a chamber in series before a first substrate in a lot is transported into the chamber, and placing each of the plurality of dummy wafers on a susceptor; a step (b) of irradiating a back surface of each of the plurality of dummy wafers disposed on the susceptor with light from continuous lighting lamps to heat the dummy wafer, and subsequently irradiating a front surface of each of the plurality of dummy wafers with a flash of light from the flash lamps to heat the dummy wafer; and a step (c) of measuring a back surface temperature of each of the plurality of dummy wafers at a time when a predetermined period of time has elapsed since the flash lamps and the continuous lighting lamps were turned off, wherein the step (a) and the step (b) are repeated until a back surface temperature of the plurality of dummy wafers measured in the step (c) becomes constant, and subsequently, processing on the first substrate in the lot is started.

The dummy wafer is heated to a higher temperature and an interior of the chamber is preheated, thus the temperature within the chamber can be efficiently stabilized in a short time.

It is preferable that the heat treatment method further includes: a step (d) of measuring a surface achieving temperature of each of the plurality of dummy wafers at a time of flash irradiation from the flash lamps, wherein the step (a) and the step (b) are repeated until both the back surface temperature measured in the step (c) and the surface achieving temperature measured in the step (d) become constant in the plurality of dummy wafers, and subsequently, processing on the first substrate in the lot is started.

The processing on the first substrate in the lot can be started after the temperature within the chamber is reliably stabilized.

According to another aspect of the present invention, the heat treatment method includes: a step (a) of transporting a plurality of dummy wafers into a chamber in series before a first substrate in a lot is transported into the chamber, and placing each of the plurality of dummy wafers on a susceptor; a step (b) of irradiating a back surface of each of the plurality of dummy wafers disposed on the susceptor with light from continuous lighting lamps to heat the dummy wafer, and subsequently irradiating a front surface of each of the plurality of dummy wafers with a flash of light from the flash lamps to heat the dummy wafer; and a step (c) of measuring a surface achieving temperature of each of the plurality of dummy wafers at a time of flash irradiation from the flash lamps, wherein the step (a) and the step (b) are repeated until the surface achieving temperature of the plurality of dummy wafers measured in the step (c) becomes constant, and subsequently, processing on the first substrate in the lot is started.

The dummy wafer is heated to a higher temperature and an interior of the chamber is preheated, thus the temperature within the chamber can be efficiently stabilized in a short time.

Therefore, a first object of the present invention is to reduce the number of consumed dummy wafers.

A second object of the present invention is to efficiently stabilize the temperature within the chamber in a short time.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a drawing showing a measurement temperature measured with a lower radiation thermometer when the semiconductor wafer is processed by the heat treatment apparatus.

DESCRIPTION OF THE PREFERRED EMBODIMENTS

Embodiments according to the present invention will now be described in detail with reference to the drawings.

First Embodiment

Figure 1:
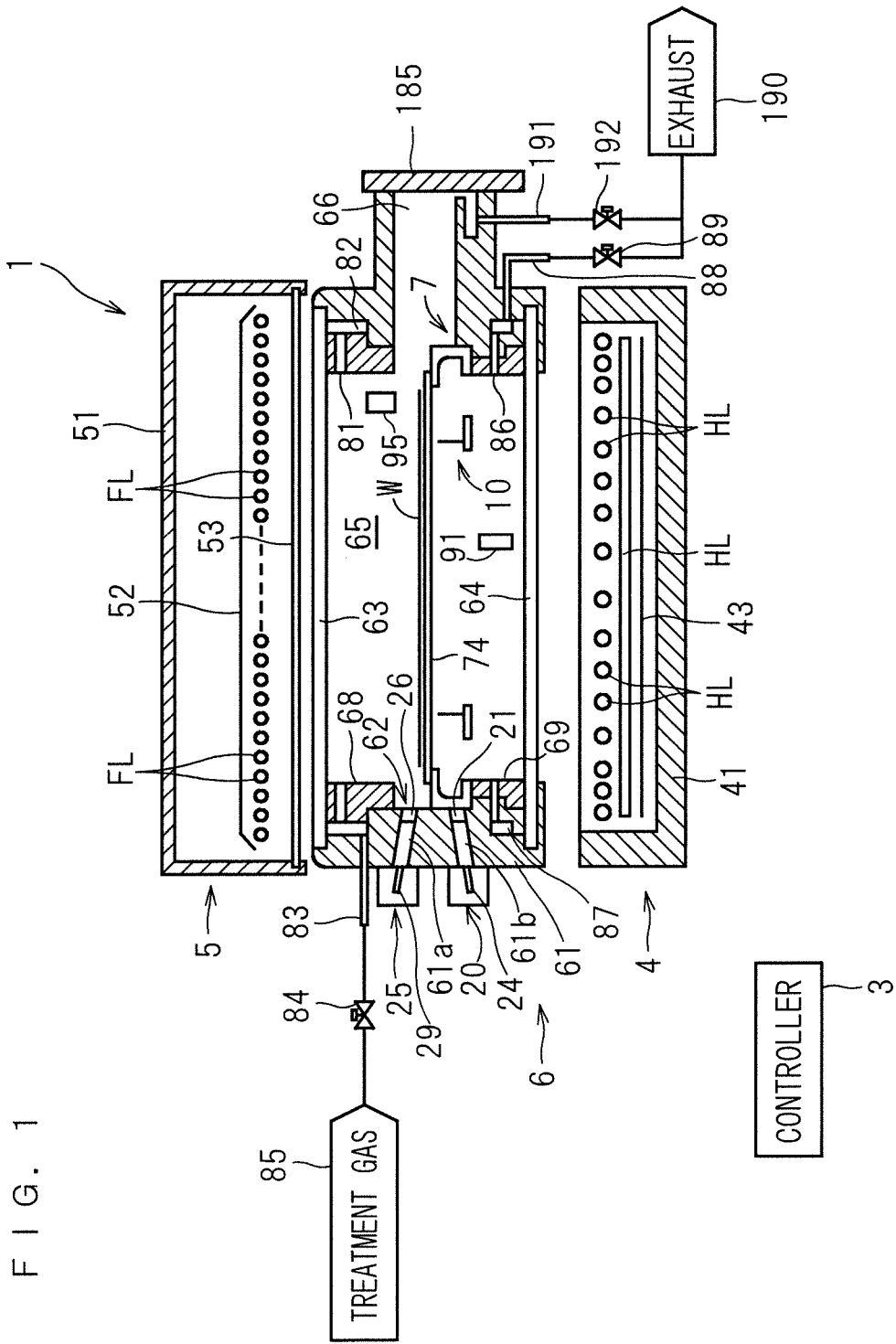
FIG. 1 is a longitudinal sectional view showing a configuration of a heat treatment apparatus performing a heat treatment method according to the present invention.

FIG. 1 is a longitudinal sectional view showing a configuration of a heat treatment apparatus 1 performing a heat treatment method according to the present invention. The heat treatment apparatus 1 in FIG. 1 is a flash lamp annealer for heating a disk-shaped semiconductor wafer W serving as a substrate by irradiating the semiconductor wafer W with a flash of light. A size of the semiconductor wafer W to be processed is not particularly limited. For example, the semiconductor wafer W to be processed has a diameter of 300 mm or 450 mm (300 mm in the present preferred embodiment). It should be noted that dimensions of components and the number of components are shown in exaggeration or in simplified form, as appropriate, in FIG. 1 and the subsequent drawings for the sake of easier understanding.

The heat treatment apparatus 1 includes a chamber 6 for housing the semiconductor wafer W, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding the semiconductor wafer W in a horizontal attitude, and a transfer mechanism 10 provided inside the chamber 6 and for transferring the semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to execute a heat treatment on the semiconductor wafer W.

The chamber 6 is configured such that upper and lower chamber windows made of quartz are mounted to the top and bottom, respectively, of a tubular chamber side portion 61. The chamber side portion 61 has a generally tubular shape having an open top and an open bottom. An upper chamber window 63 is mounted to block the top opening of the chamber side portion 61, and a lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds the semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of the semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, the semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a and a through hole 61b bored therein. The through hole 61a is a cylindrical hole for directing infrared radiation emitted from an upper surface of the semiconductor wafer W held by a susceptor 74 to be described later therethrough to an infrared radiation sensor 29 of an upper radiation thermometer 25. In the meanwhile, the through hole 61b is a cylindrical hole for directing infrared radiation emitted from a lower surface of the semiconductor wafer W therethrough to an infrared radiation sensor 24 of a lower radiation thermometer 20. The through hole 61a and the through hole 61b are inclined with respect to a horizontal direction so that an axis extending in a direction in which the through holes 61a and 61b extend through the chamber side portion 61 intersects a main surface of the semiconductor wafer W held by the susceptor 74. A transparent window 26 made of calcium fluoride material transparent to infrared radiation in a wavelength range measurable with the upper radiation thermometer 25 is mounted to an end portion of the through hole 61a which faces the heat treatment space 65. A transparent window 21 made of barium fluoride material transparent to infrared radiation in a wavelength range measurable with the lower radiation thermometer 20 is mounted to an end portion of the through hole 61b which faces the heat treatment space 65.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is supplied from the treatment gas supply source 85 to the buffer space 82. The treatment gas which has flowed into the buffer space 82 flows in a spreading manner within the buffer space 82 which is lower in fluid resistance than the gas supply opening 81, and is supplied through the gas supply opening 81 into the heat treatment space 65. An inert gas such as nitrogen ($N_2$), a reactive gas such as hydrogen ($H_2$) and ammonia ($NH_3$), or a gas mixture thereof, for example, can be used as the treatment gas (nitrogen gas in the present preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 may be mechanisms provided in the heat treatment apparatus 1 or be a utility in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
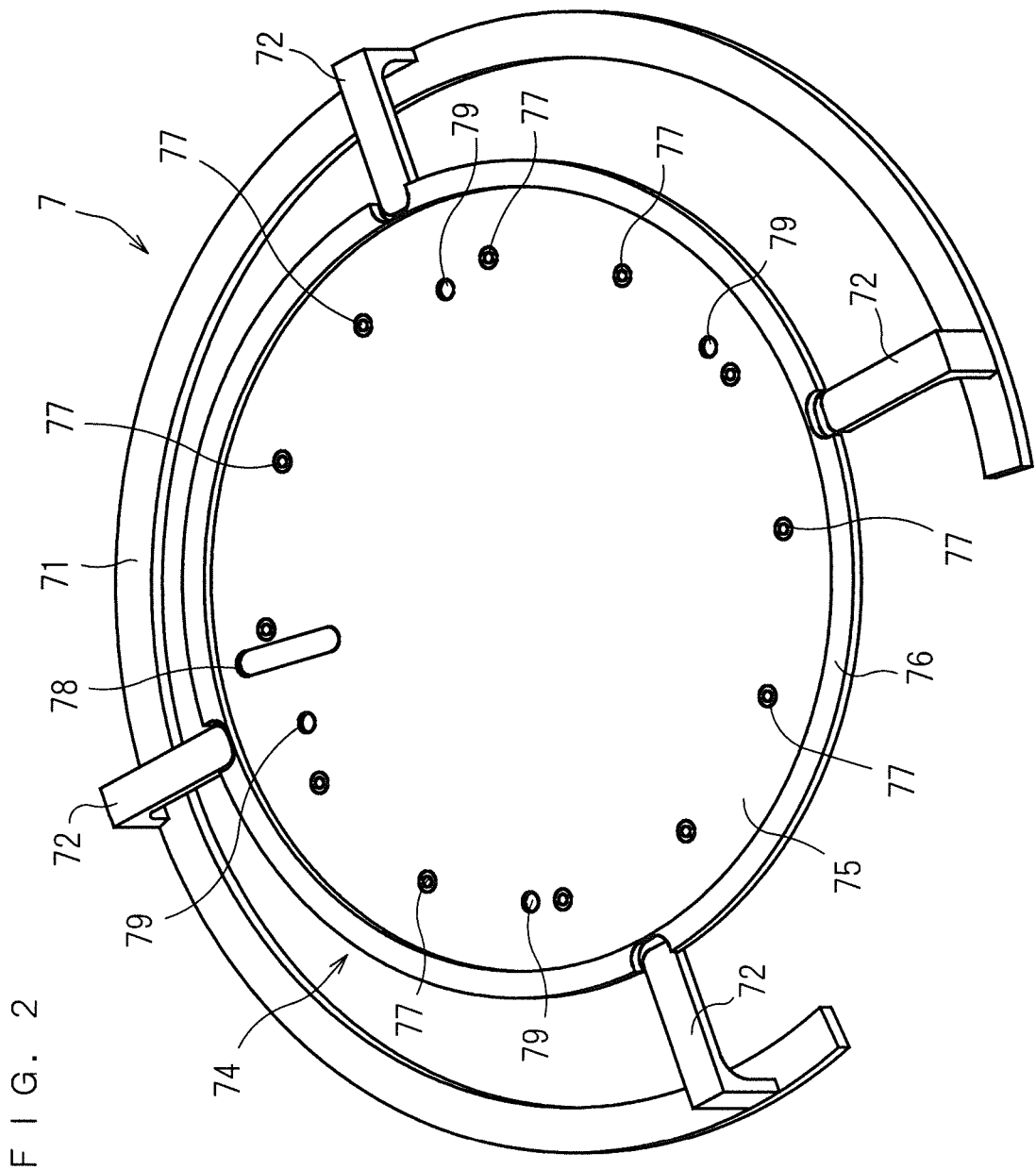
FIG. 2 is a perspective view showing an entire external appearance of a holder.

FIG. 2 is a perspective view showing an entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are also quartz members, and are rigidly secured to the base ring 71 by welding.

Figure 3:
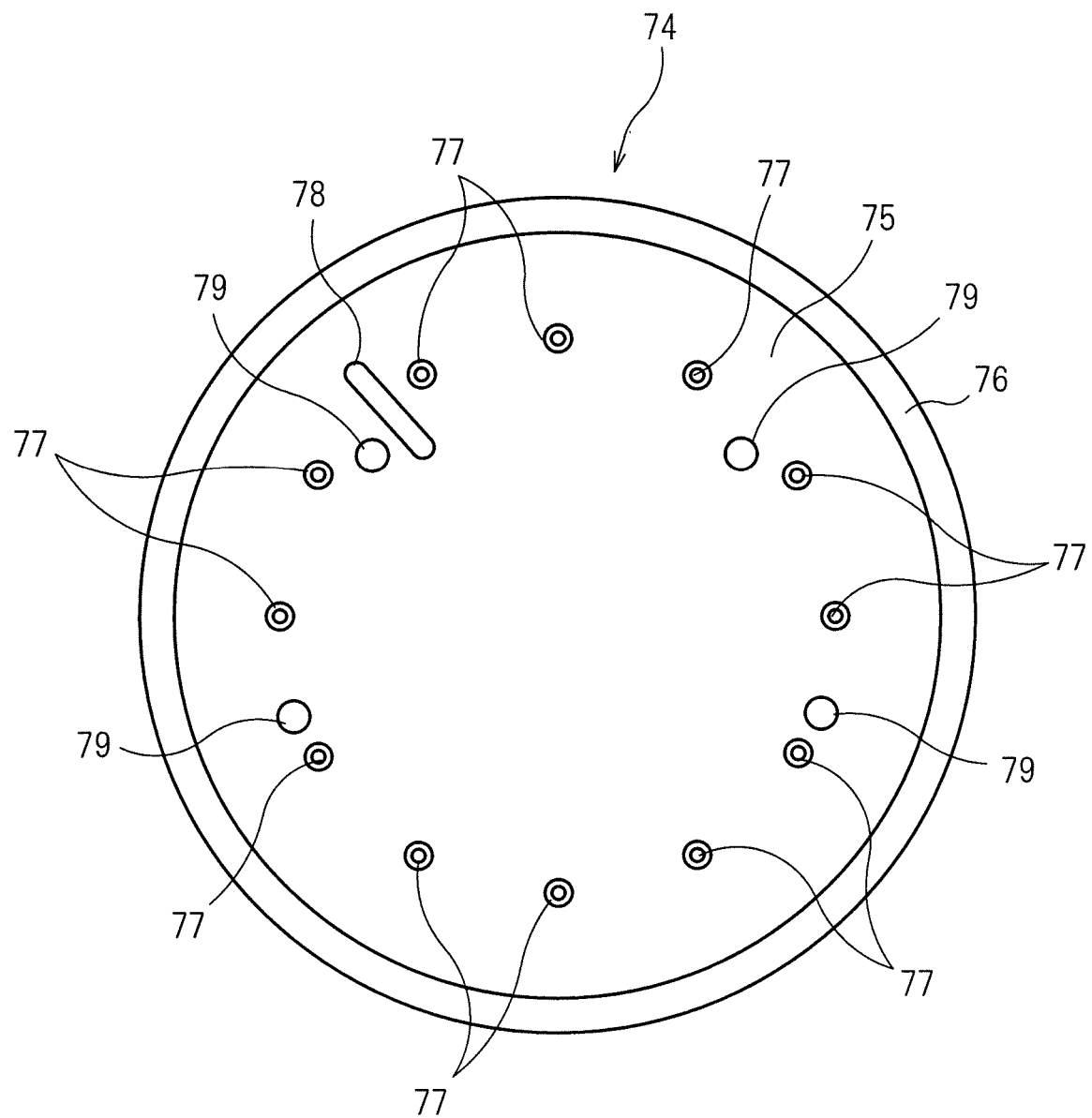
FIG. 3 is a plan view of a susceptor.
Figure 4:
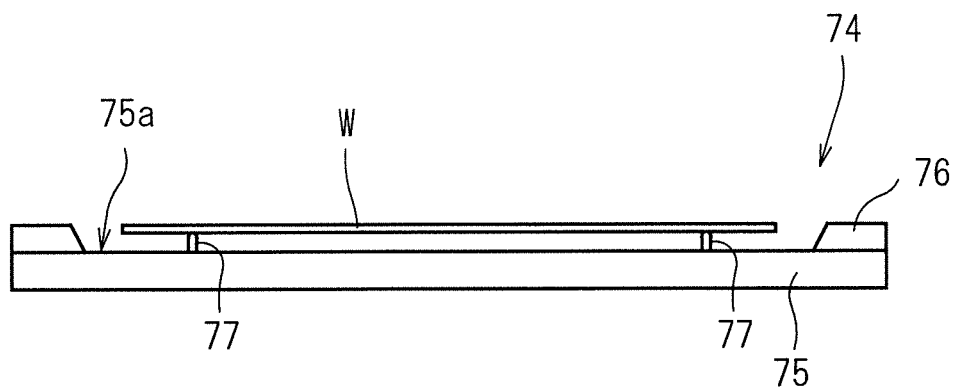
FIG. 4 is a sectional view of the susceptor.

The susceptor 74 is supported by the four coupling portions 72 provided on the base ring 71. FIG. 3 is a plan view of the susceptor 74. FIG. 4 is a cross-sectional view of the susceptor 74. The susceptor 74 includes a holding plate 75, a guide ring 76, and a plurality of substrate support pins 77. The holding plate 75 is a generally circular planar member made of quartz. A diameter of the holding plate 75 is greater than that of the semiconductor wafer W. In other words, the holding plate 75 has a size, as seen in plan view, greater than that of the semiconductor wafer W.

The guide ring 76 is provided on a peripheral part of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral part of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

The semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W can be supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. A thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is provided for the lower radiation thermometer 20 to receive radiation (infrared radiation) emitted from the lower surface of the semiconductor wafer W. That is to say, the lower radiation thermometer 20 receives the radiation emitted from the lower surface of the semiconductor wafer W through the opening 78 and the transparent window 21 mounted to the through hole 61b in the chamber side portion 61 to measure the temperature of the semiconductor wafer W. The holding plate 75 of the susceptor 74 further includes four through holes 79 bored therein and designed so that lift pins 12 of the transfer mechanism 10 to be described later pass through the through holes 79, respectively, to transfer the semiconductor wafer W.

Figure 5:
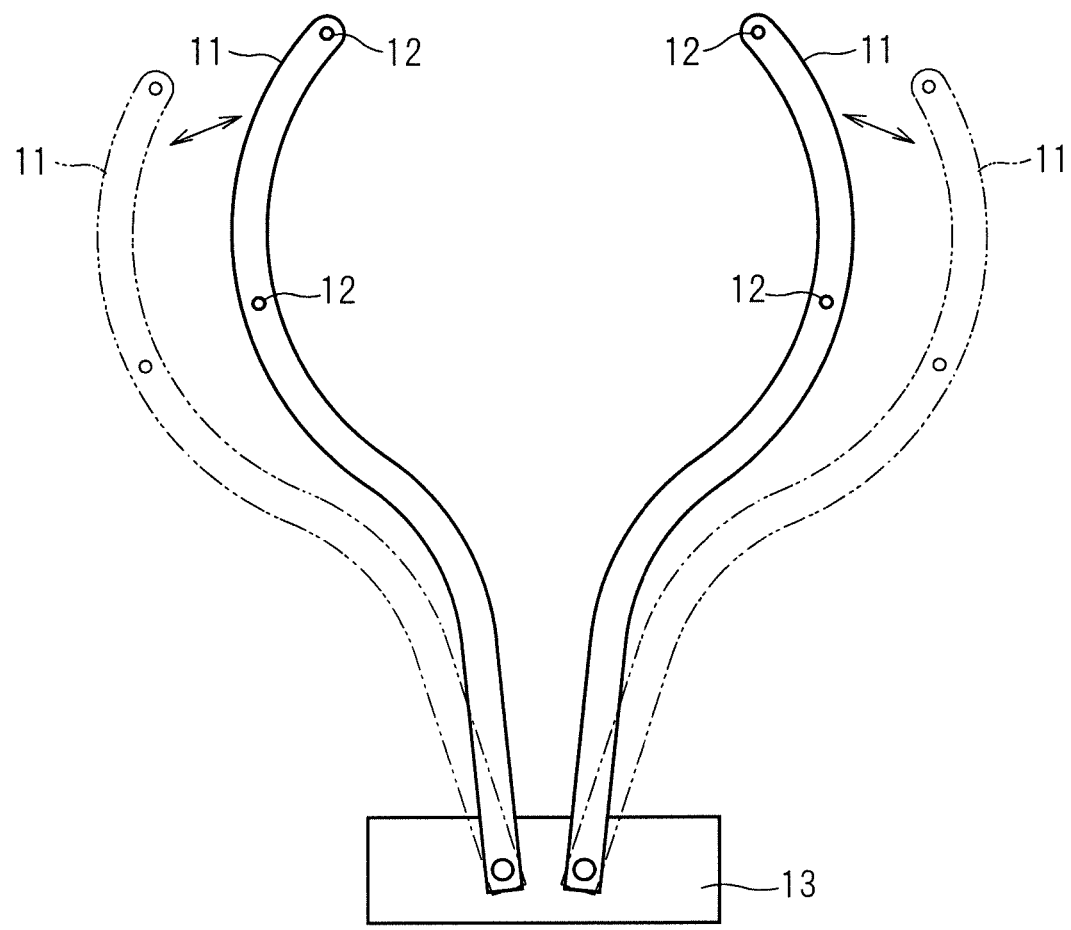
FIG. 5 is a plan view of a transfer mechanism.
Figure 6:
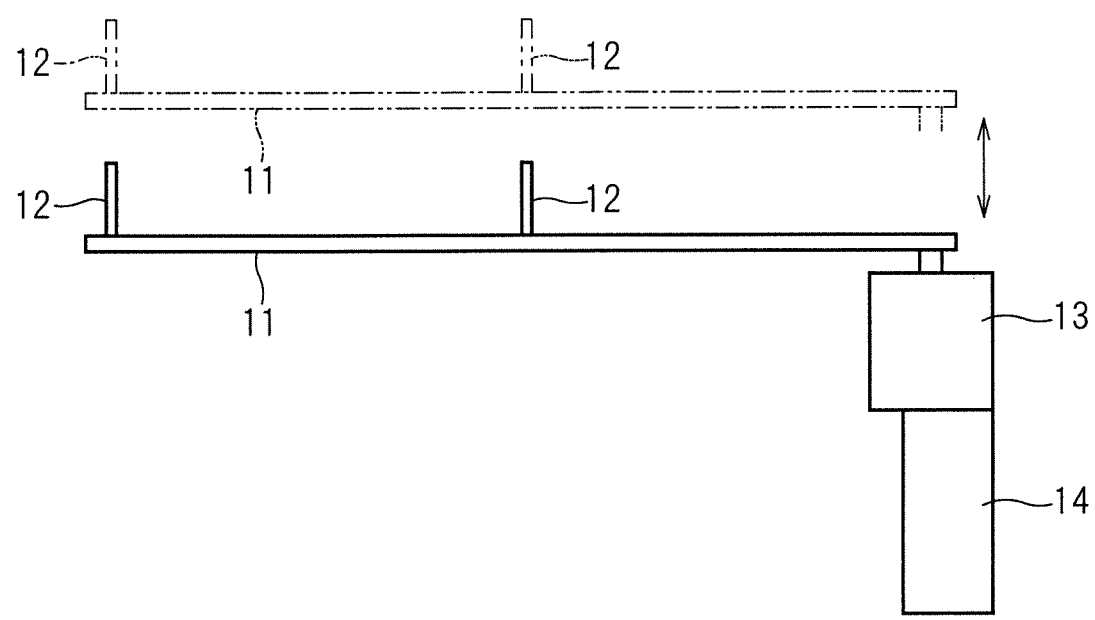
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which the semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses the linkage mechanism to cause a single motor to pivot the pair of transfer arms 11 in cooperative relation.

The pair of transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of the semiconductor wafer W held by the holder 7 (that is, in the horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to an outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. This xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect the flash of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

Figure 7:
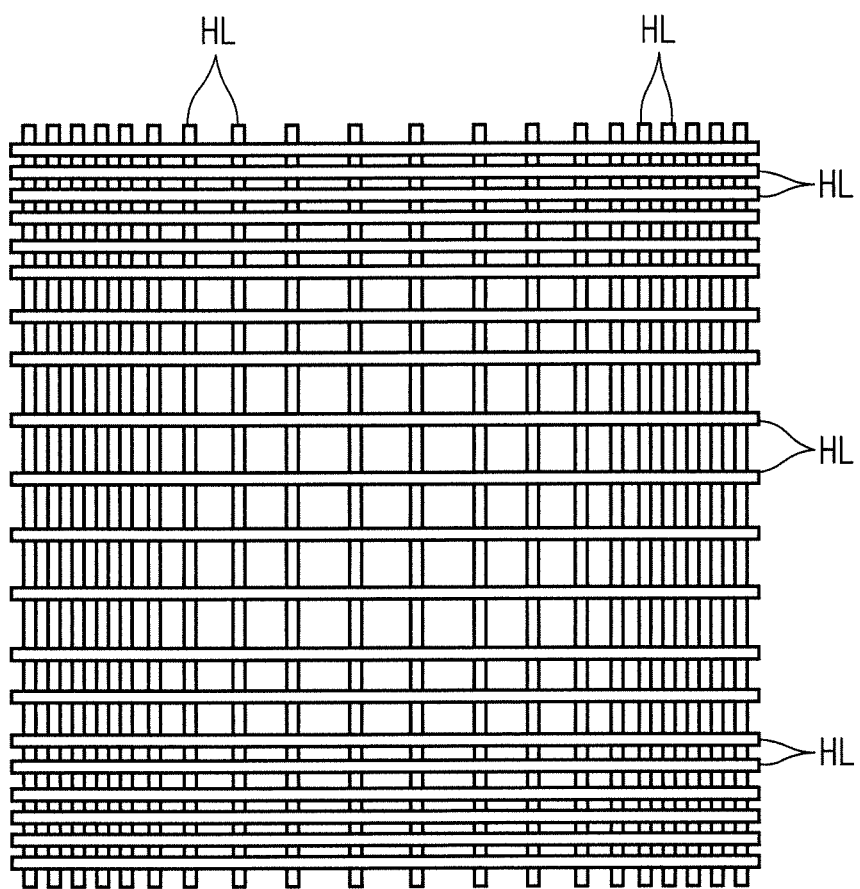
FIG. 7 is a plan view showing an arrangement of a plurality of halogen lamps.

FIG. 7 is a plan view showing an arrangement of the multiple halogen lamps HL. The 40 halogen lamps HL are arranged in two tiers, i.e. upper and lower tiers. 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of the semiconductor wafer W held by the holder 7 (that is, in the horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral part of the semiconductor wafer W held by the holder 7 than in a region opposed to a central part thereof. In other words, the halogen lamps HL in each of the upper and lower tiers are arranged at shorter intervals in the peripheral part of the lamp arrangement than in the central part thereof. This allows a greater amount of light to impinge upon the peripheral part of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

As illustrated in FIG. 1, the chamber 6 is provided with two radiation thermometers of the upper radiation thermometer 25 and the lower radiation thermometer 20 (pyrometer in the present preferred embodiment). The upper radiation thermometer 25 is disposed obliquely above the semiconductor wafer W held by the susceptor 74, and receives the infrared radiation emitted from the upper surface of the semiconductor wafer W to measure the temperature of the upper surface. The infrared radiation sensor 29 of the upper radiation thermometer 25 includes an optical element of Indium antimony (InSb) to cope with a rapid temperature change in the upper surface of the semiconductor wafer W at the moment of the flash irradiation. In the meanwhile, the lower radiation thermometer 20 is disposed obliquely below the semiconductor wafer W held by the susceptor 74, and receives the infrared radiation emitted from the lower surface of the semiconductor wafer W to measure the temperature of the lower surface.

The chamber 6 is further provided with a susceptor thermometer 91 and an atmospheric thermometer 95. The susceptor thermometer 91 is a radiation thermometer, and receives infrared radiation emitted from the susceptor 74 to measure the temperature of the susceptor 74. The atmospheric thermometer 95 includes a thermocouple, and measures an atmospheric temperature of the heat treatment space 65 in the chamber 6. The susceptor thermometer 91 and the atmospheric thermometer 95 are illustrated in the chamber 6 in FIG. 1 for convenience of illustration, however, they may also be attached to the chamber side portion 61 as with the upper radiation thermometer 25 and the lower radiation thermometer 20.

Figure 8:
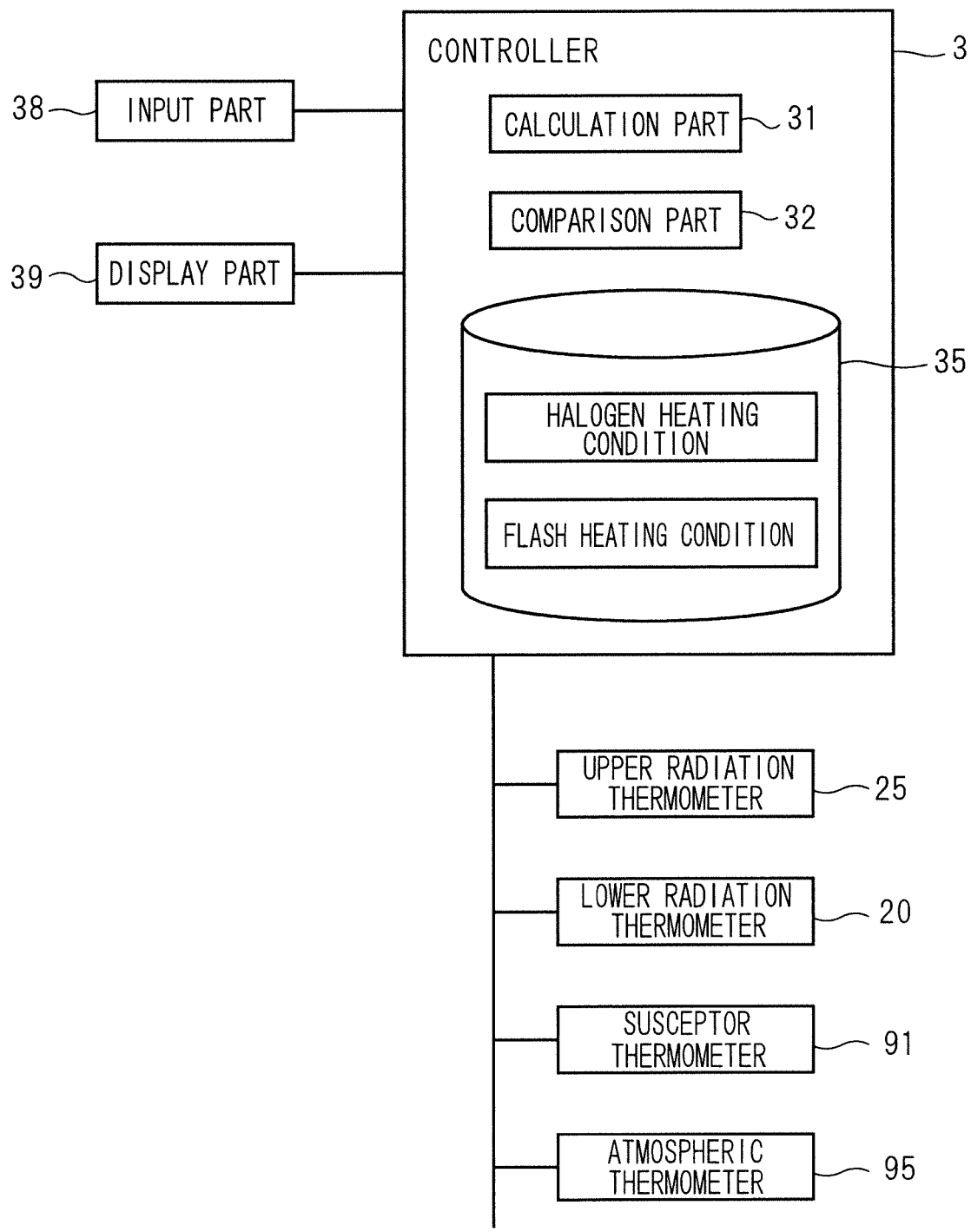
FIG. 8 is a block diagram showing a configuration of a controller.

The controller 3 controls the aforementioned various operating mechanisms provided in the heat treatment apparatus 1. FIG. 8 is a block diagram showing a configuration of the controller 3. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk 35 for storing control software, data and the like therein. The CPU in the controller 3 executes a predetermined treatment program, whereby the processes in the heat treatment apparatus 1 proceed.

As illustrated in FIG. 8, the controller 3 includes a calculation part 31 and a comparison part 32. The calculation part 31 and the comparison part 32 are each function processing part achieved by a CPU in the controller 3 executing a predetermined treatment program. Processing details of the calculation part 31 and the comparison part 32 will be described in more detail below.

The upper radiation thermometer 25, the lower radiation thermometer 20, the susceptor thermometer 91, and the atmospheric thermometer 95 are connected to the controller 3. Temperature measurement results by the upper radiation thermometer 25, the lower radiation thermometer 20, the susceptor thermometer 91, and the atmospheric thermometer 95 are transmitted to the controller 3. Furthermore, a display part 39 and an input part 38 are connected to the controller 3. The controller 3 displays various types of information on the display part 39. An operator of the heat treatment apparatus 1 can input various commands and parameters from the input part 38 while confirming the information displayed on the display part 39. A keyboard or a mouse, for example, can be used as the input part 38. A liquid crystal display, for example, can be used as the display part 39. In the present preferred embodiment, a liquid crystal touch panel provided on an outer wall of the heat treatment apparatus 1 is adopted as the display part 39 and the input part 38 to double both functions.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of the semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

A treatment operation in the heat treatment apparatus 1 is described next. A heat treatment operation performed on a normal semiconductor wafer (product wafer) W which becomes a product is described herein first. The process procedure in the semiconductor wafer W described hereinafter proceeds when the controller 3 controls each operation mechanism of the heat treatment apparatus 1.

Firstly, the valve 84 for air supply is opened and the valve 89 for air exhaust are opened to start air supply and exhaust within the chamber 6 prior to the treatment of the semiconductor wafer W. When the valve 84 is opened, nitrogen gas is supplied from the gas supply opening 81 into the heat treatment space 65. Also, when the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. The nitrogen gas is continuously supplied into the heat treatment space 65 at the time of the heat treatment of the semiconductor wafer W in the heat treatment apparatus 1, and an amount of supply is appropriately changed in accordance with a treatment process.

Subsequently, the gate valve 185 is opened to open the transport opening 66. A transport robot outside the heat treatment apparatus 1 transports the semiconductor wafer W to be processed through the transport opening 66 into the heat treatment space 65 in the chamber 6. At this time, there is a possibility that the atmosphere outside the apparatus is carried into the heat treatment space 65 as the semiconductor wafer W is transported into the heat treatment space 65, however, the nitrogen gas is continuously supplied into chamber 6, thus the nitrogen gas flows through the transport opening 66 and it is possible to minimize an outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that a front surface as a processed surface is the upper surface. A predetermined distance is defined between a back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held in the horizontal attitude from below by the susceptor 74 of the holder 7 formed of quartz, the 40 halogen lamps HL in the halogen heating part 4 are turned on at the same time and preheating (or assist-heating) is started. Halogen light emitted from the halogen lamps HL is transmitted through the lower chamber window 64 and the susceptor 74 both made of quartz, and impinges on the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W which is on the increase by the irradiation with light from the halogen lamps HL is measured with the lower radiation thermometer 20. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the lower radiation thermometer 20.

After the temperature of the semiconductor wafer W reaches the preheating temperature T1, the controller 3 maintains the temperature of the semiconductor wafer W at the preheating temperature T1 for a short time. Specifically, at a time when the temperature of the semiconductor wafer W measured with the lower radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in the peripheral portion thereof where heat dissipation is liable to occur than in the central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL in the flash heating part 5 irradiate the front surface of the semiconductor wafer W held by the susceptor 74 with a flash of light at a time when a predetermined time period has elapsed since the temperature of the semiconductor wafer W reaches the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such a flash of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W flash-heated by the flash irradiation from the flash lamps FL is increased instantaneously to a treatment temperature T2 of 1000° C. or more, and then the temperature of the front surface decreases rapidly.

When the flash heating treatment is finished, the halogen lamps HL are turned off after an elapse of a predetermined time. Accordingly, the temperature of the semiconductor wafer W decreases rapidly from the preheating temperature T1. The lower radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the lower radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 out of the chamber 6. Thus, the heating treatment of the semiconductor wafer W is completed.

A treatment of the semiconductor wafer W is typically performed in a unit of lot. The lot indicates one group of semiconductor wafer W subjected to the same treatment under the same condition. Also in the heat treatment apparatus 1 of the present preferred embodiment, the plurality of semiconductor wafers W constituting the lot are transported into the chamber 6 in series and the heat treatment is performed.

Herein, when the processing on the lot is started in the heat treatment apparatus 1 which has not performed the processing for a while, the first semiconductor wafer W in the lot is transported into the chamber 6 having substantially a room temperature, and then the heating treatment is performed. Examples of such a case include a case where a first lot is processed when the heat treatment apparatus 1 is activated after maintenance or a case where a long period of time has passed after processing a preceding lot. At the time of the heat treatment, a heat conduction from the semiconductor wafer W increased in temperature to the susceptor 74 occurs, thus the susceptor 74 which initially has a room temperature is gradually increased in temperature by a thermal storage as the number of semiconductor wafers W which have been processed increases.

When the heat treatment is performed on around ten semiconductor wafers W, the temperature of the in-chamber structure such as the susceptor 74 reaches a certain stable temperature. A heat transfer amount from the semiconductor wafer W to the susceptor 74 is larger than a heat radiation amount from the susceptor 74 until the temperature of the susceptor 74 reaches the stable temperature, thus the temperature of the susceptor 74 gradually increases by the thermal storage as the number of semiconductor wafers W which have been processed increases. In contrast, after the temperature of the susceptor 74 reaches the stable temperature, the heat transfer amount from the semiconductor wafer W to the susceptor 74 comes into balance with the heat radiation amount from the susceptor 74, thus the temperature of the susceptor 74 is maintained at the certain stable temperature. The stable temperature of the in-chamber structure such as the susceptor 74 indicates a temperature of the in-chamber structure such as the susceptor 74 when the temperature of the in-chamber structure is increased to be stable by continuously performing the heat treatment on the plurality of semiconductor wafers W in the lot in the chamber 6 without preheating the in-chamber structure. The in-chamber structure such as the susceptor 74 includes the chamber side portion 61, the transparent windows 21 and 26, the upper chamber window 63, the lower chamber window 64, and the reflective rings 68 and 69 besides the susceptor 74.

As described above, when the processing on the lot is started in the chamber 6 at the room temperature, the semiconductor wafer W is held by the susceptor 74 at around the room temperature in the initial stage, but in contrast, the semiconductor wafer W is held by the susceptor 74 whose temperature is increased to the stable temperature in the latter half. That is to say, there is a problem that a temperature history becomes ununiform due to the difference of the temperature of the in-chamber structure such as the susceptor 74 between the semiconductor wafer W early in the lot and the semiconductor wafer W at the midpoint of the lot. Thus, conventionally performed is a dummy running in which a plurality of dummy wafers which are not to be processed are transported into the chamber 6 and the heat treatment is performed on the dummy wafers to increase the temperature of the in-chamber structure such as the susceptor 74 to the stable temperature before starting the processing on the lot. However, as described above, the dummy running performed by consuming the plurality of dummy wafers increases a running cost and also causes reduction in production efficiency. Thus, in the present preferred embodiment, the following processing is performed so that the number of consumed dummy wafers can be reduced as much as possible.

Figure 9:
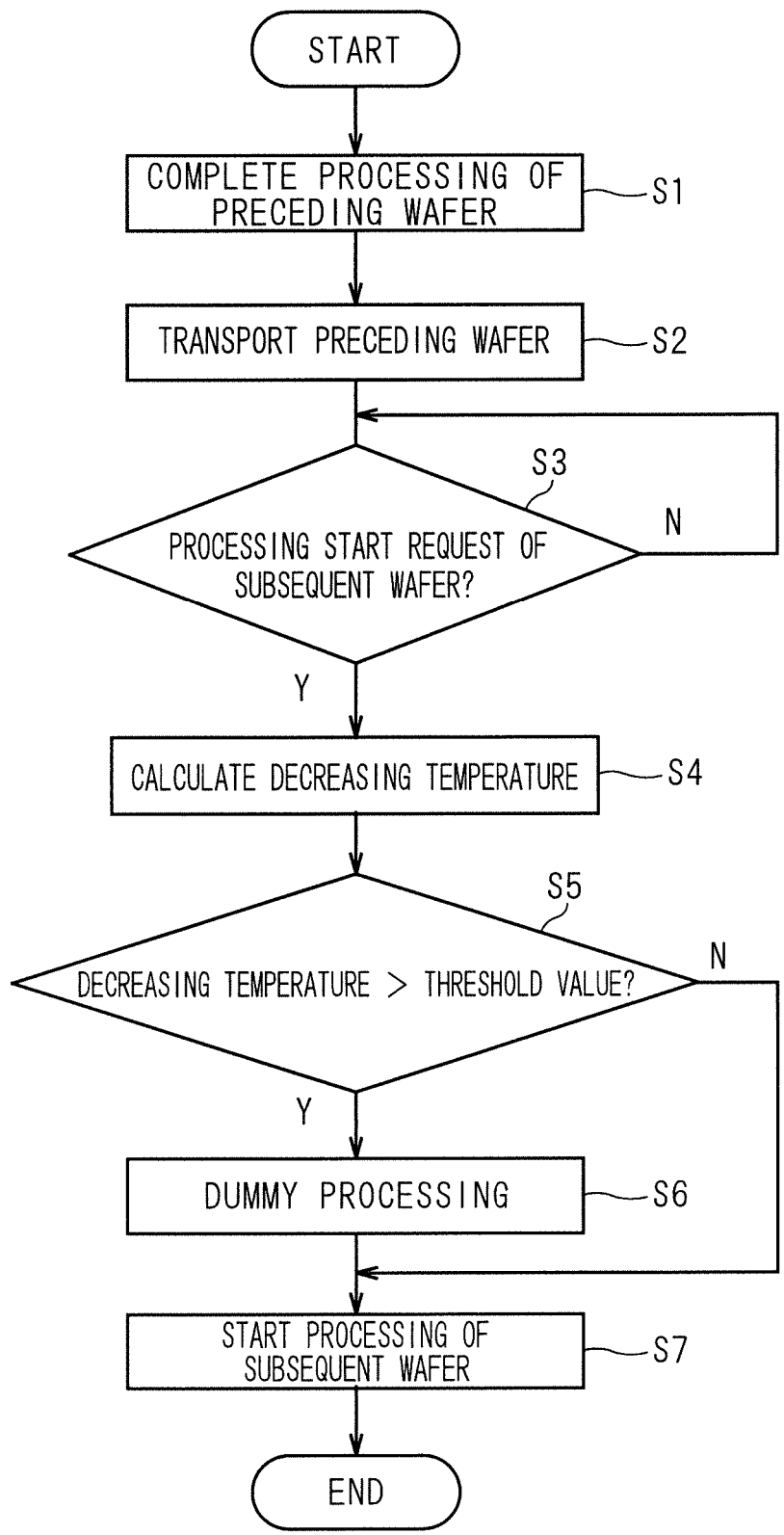
FIG. 9 is a flow chart showing a procedure after a semiconductor wafer is processed.

FIG. 9 is a flow chart showing a procedure after the semiconductor wafer W is processed. The heat treatment apparatus 1 executes processing on a preceding semiconductor wafer W (referred to as a preceding wafer hereinafter). FIG. 10 is a drawing showing a measurement temperature measured with the lower radiation thermometer 20 when the semiconductor wafer W is processed by the heat treatment apparatus 1. The processing performed on the preceding wafer is as described above. That is to say, the preceding wafer held by the susceptor 74 is irradiated with light from the halogen lamps HL, thereby being preheated to the preheating temperature T1. Subsequently, a front surface of the preceding wafer is irradiated with a flash of light from the flash lamps FL to perform a flash heating. The flash heating is finished, and the flash lamps FL and the halogen lamps HL turn off at the same time, thus the processing on the preceding wafer is completed (Step S1).

When the processing on the preceding wafer is completed and both the flash lamps FL and the halogen lamps HL turn off at a time t1, the temperature of the semiconductor wafer W decreases. The temperature of the in-chamber structure such as the susceptor 74 also decreases. The temperature of the semiconductor wafer W decreasing after the time t1 is measured with the lower radiation thermometer 20. Then, the preceding wafer is transported from the chamber 6 at a time t2 (Step S2). Defined as a transportation temperature T3 is a temperature within the chamber 6 measured with the lower radiation thermometer 20 at the time t2 when the preceding wafer is transported from the chamber 6.

The temperature is continuously measured with the lower radiation thermometer 20 after the preceding wafer is transported from the chamber 6. The susceptor 74 does not hold the semiconductor wafer W after the preceding wafer is transported from the chamber 6, thus the lower radiation thermometer 20 measures the temperature within the chamber 6.

Next, the controller 3 performs a processing start request for requesting a start of processing on the semiconductor wafer W to be processed subsequent to the preceding wafer described above (referred to as a subsequent wafer hereinafter) at a time t3 (Step S3). A measurement temperature T4 indicates a temperature within the chamber 6 measured with the lower radiation thermometer 20 at the time t3 when the processing start request on the subsequent wafer is performed. Then, the calculation part 31 of the controller 3 calculates a decreasing temperature from the time t2 to the time t3 (Step S4). Specifically, the calculation part 31 calculates a difference ΔT between the transportation temperature T3 at the time t2 and the measurement temperature T4 at the time t3. For example, when the preceding wafer and the subsequent wafer are in the same lot, the period of time between the time t2 and the time t3 is often relatively short, and when the preceding wafer is the last semiconductor wafer W in the preceding lot and the subsequent wafer is the first semiconductor wafer W in the subsequent lot, the period of time between the time t2 and the time t3 is often relatively long.

Subsequently, the comparison part 32 of the controller 3 compares the difference ΔT described above which is the decreasing temperature from the time t2 to the time t3 with a predetermined threshold value (Step S5). The predetermined threshold value is preset as a parameter and stored in a storage of the controller 3. An appropriate value can be set as the predetermined threshold value, and the predetermined threshold value is set to 5° C., for example.

When the difference ΔT which is the decreasing temperature is larger than the predetermined threshold value as a result of the comparison by the comparison part 32, the processing proceeds from Step S5 to Step S6, and dummy processing is executed. The dummy processing in the present preferred embodiment indicates stabilization processing of preheating the in-chamber structure such as the susceptor 74 to the stable temperature by the irradiation with light from the halogen lamps HL and the flash lamps Fl. The dummy processing is performed regardless of presence or absence of the dummy wafer, and the dummy processing is executed using the dummy wafer in the first embodiment. The dummy wafer is a disk-shaped silicon wafer similar to the semiconductor wafer W which becomes a product, and has a size and a shape similar to the semiconductor wafer W. However, a pattern formation and an ion implantation are not performed on the dummy wafer. That is to say, the dummy wafer is a so-called bare wafer. The dummy processing in the first embodiment is performed by heating the dummy wafer, which is in a state of being held by the susceptor 74, by the irradiation of light from the halogen lamps HL and subsequently flash-heating the dummy wafer by the flash irradiation from the flash lamps FL. The in-chamber structure such as the susceptor 74 is preheated to the stable temperature by a heat conduction and a heat radiation from the dummy wafer heated by the irradiation of light from the halogen lamps HL and the flash lamps FL and increased in temperature. In the dummy processing, the irradiation of light from the halogen lamps HL and the flash lamps FL may be performed repeatedly on the plurality of dummy wafers in series to heat the in-chamber structure such as the susceptor 74.

The processing on the subsequent wafer is started after finishing the dummy processing (Step S7). The processing performed on the subsequent wafer is also as described above. That is to say, the subsequent wafer transported into the chamber 6 and held by the susceptor 74 is irradiated with light from the halogen lamps HL, thereby being preheated to the preheating temperature T1. Subsequently, a front surface of the subsequent wafer is irradiated with a flash of light from the flash lamps FL to perform a flash heating.

In the meanwhile, when the difference ΔT which is the decreasing temperature is equal to or smaller than the predetermined threshold value, the processing proceeds from Step S5 to Step S7, and the subsequent wafer is transported into the chamber 6 without executing the dummy processing of Step S6, and the processing on the subsequent wafer is started.

In the first embodiment, the difference ΔT between the transportation temperature T3 measured with the lower radiation thermometer 20 at the time t2 when the preceding wafer is transported from the chamber 6 and the measurement temperature T4 measured with the lower radiation thermometer 20 at the time t3 is calculated as the decreasing temperature after the preceding wafer is transported from the chamber 6. The difference ΔT which is the decreasing temperature and the predetermined threshold value are compared with each other.

The case where the difference ΔT which is the decreasing temperature is larger than the predetermined threshold value indicates that the temperature of the in-chamber structure such as the susceptor 74 decreases largely from the stable temperature, and there is a possibility that the temperature history in the subsequent processing becomes ununiform if the processing on the subsequent wafer is proceeded as it is. Thus, when the decreasing temperature is larger than the predetermined threshold value, the dummy wafer is irradiated with light from the halogen lamps HL and the flash lamps FL to execute the dummy processing of preheating the in-chamber structure such as the susceptor 74. The in-chamber structure such as the susceptor 74 is preheated to the stable temperature by the dummy processing, the temperature history after the processing on the subsequent wafer can be uniformized.

In the meanwhile, the case where the difference ΔT which is the decreasing temperature is equal to or smaller than the predetermined threshold value indicates that the temperature of the in-chamber structure such as the susceptor 74 does not decrease from the stable temperature so much. In this case, the temperature history after the processing on the subsequent wafer is prevented from being un-uniformized even if the processing on the subsequent wafer is proceeded as it is. Thus, when the decreasing temperature is equal to or smaller than the predetermined threshold value, the dummy processing is not executed but the subsequent wafer is transported into the chamber 6 to start the processing on the subsequent wafer. According to such a process, the dummy processing is not executed when the decreasing temperature is equal to or smaller than the threshold value and thus is relatively small, thus the number of consumed dummy wafers can be reduced and a time required for the dummy processing can be reduced.

Second Embodiment

Next, a second embodiment according to the present invention will be described. The configuration of the heat treatment apparatus 1 in the second embodiment is similar to that in the first embodiment. The procedure of processing the semiconductor wafer W in the second embodiment is also the same as that in the first embodiment. Furthermore, the procedure after the processing of the semiconductor wafer W in the second embodiment is also substantially similar to that in the first embodiment (FIG. 9). The dummy processing in Step S6 is performed using the dummy wafer in the first embodiment, however, the dummy processing is executed without using the dummy wafer in the second embodiment.

In the first embodiment described above, when the dummy processing in Step S6 is executed, the dummy wafer, which is in the state of being held by the susceptor 74, is heated by the irradiation of light from the halogen lamps HL and subsequently flash-heated by the flash irradiation from the flash lamps FL. Then, the in-chamber structure such as the susceptor 74 is preheated by the heat conduction and the heat radiation from the dummy wafer heated by the irradiation of light from the halogen lamps HL and the flash lamps FL and increased in temperature. Process conditions of the halogen lamps HL at the time of performing the dummy processing using the dummy wafer (a lamp output and an emission time, for example) in such a manner are stored in a magnetic disk 35 of the controller 3, for example, as a halogen heating condition (first condition) (FIG. 8). Similarly, process conditions of the flash lamps FL at the time of performing the dummy processing using the dummy wafer (a lamp output and a light emission pulse width, for example) are stored in a magnetic disk 35 as a flash heating condition (second condition).

In the second embodiment, when the difference ΔT which is the decreasing temperature is larger than the predetermined threshold value and the dummy processing in Step S6 is performed, the dummy processing is executed without using the dummy wafer. Specifically, the irradiation of light from the halogen lamps HL and the flash lamps FL is performed in a state where the dummy wafer is not transported into the chamber 6 and the susceptor 74 holds nothing. The halogen heating condition and the flash heating condition stored in the magnetic disk 35 are used as the process conditions of the halogen lamps HL and the process conditions of the flash lamps FL at this time, respectively. In other words, the dummy processing is executed without the dummy wafer under the same process conditions as those in the case of the dummy processing using the dummy wafer.

Even when the irradiation of light from the halogen lamps HL and the flash lamps FL is performed in the state where the dummy wafer is not used and the susceptor 74 holds nothing, the susceptor 74 directly absorbs the light and the in-chamber structure such as the susceptor 74 is preheated. Accordingly, the temperature history after the processing on the subsequent wafer can be uniformized in the manner similar to the first embodiment. In the second embodiment, the dummy processing is executed without using the dummy wafer, thus the number of consumed dummy wafers can be reduced.

Third Embodiment

Next, a third embodiment according to the present invention will be described. The configuration of the heat treatment apparatus 1 in the third embodiment is similar to that of the first embodiment. The procedure of processing the semiconductor wafer W in the third embodiment is also the same as that in the first embodiment 1. Performed in the third embodiment is a dummy running (dummy processing) in which the dummy wafer which is not to be processed is transported into the chamber 6 and a heat treatment is performed before starting processing on a lot to increase a temperature of the in-chamber structure such as the susceptor 74. Such a dummy processing is executed not only in a case of starting the processing on the lot in the chamber 6 at the room temperature but also in a case of changing the preheating temperature T1 and the treatment temperature T2. Dummy processing according to a third embodiment is described hereinafter.

The dummy processing is executed by transporting the dummy wafer which is not to be processed into the chamber 6 and performing the heat treatment by the irradiation of light from the halogen lamps HL and the heat treatment by the flash irradiation from the flash lamps FL. The dummy wafer is a disk-shaped silicon wafer similar to the semiconductor wafer W which becomes a product, and has a size and a shape similar to the semiconductor wafer W. However, a pattern formation and an ion implantation are not performed on the dummy wafer. That is to say, the dummy wafer is a so-called bare wafer.

The transportation of the dummy wafer into the chamber 6 is performed by the procedure similar to that of the semiconductor wafer W described above. Then, after the dummy wafer is held by the susceptor 74 made of quartz, the halogen lamps HL are started to be turned on. Light emitted from the halogen lamps HL is transmitted through the lower chamber window 64 and the susceptor 74 both made of quartz, and impinges on the back surface of the dummy wafer. By receiving light irradiation from the halogen lamps HL, the dummy wafer is heated, so that the temperature of thereof increases.

Figure 11:
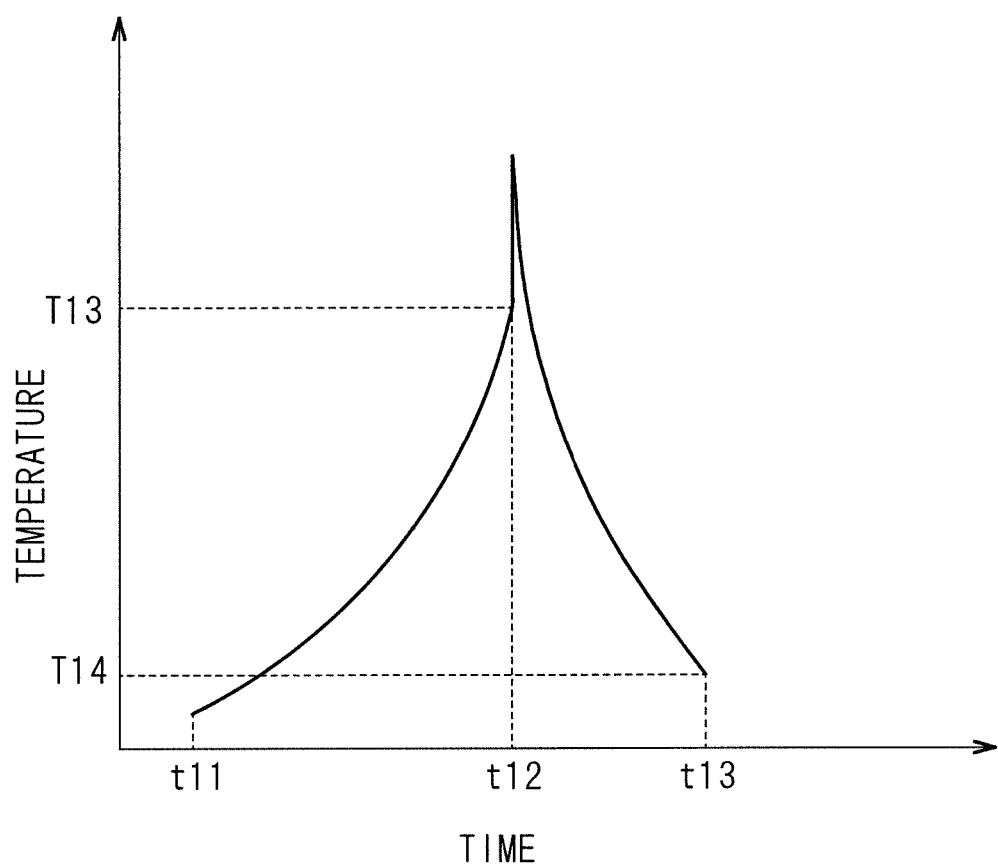
FIG. 11 is a drawing showing a temperature change of one dummy wafer in dummy processing.

FIG. 11 is a drawing showing a temperature change of one dummy wafer in dummy processing. A vertical axis in FIG. 11 indicates a temperature of the back surface of the dummy wafer measured with the lower radiation thermometer 20. The halogen lamps HL is turned on at a time t11, and the temperature of the dummy wafer is started to be increased. The flash lamps FL emit light at a time t12 when the temperature of the back surface of the dummy wafer reaches a temperature T13. The flash of light emitted from the flash lamps FL impinges on the front surface of the dummy wafer. The temperature of the dummy wafer flash-heated by the flash irradiation is further increased from the temperature T13. The temperature of the in-chamber structure such as the susceptor 74 also increases by a heat conduction and a heat radiation from the dummy wafer increased in heat.

The flash of light emitted from the flash lamps FL is emitted for about 0.1 to about 100 milliseconds as described above. That is to say, the flash lamps FL emit light and are turned off almost at the same time at the time t12. The flash lamps FL and the halogen lamps HL are turned off at the same time. The flash lamps FL and the halogen lamps HL are turned off, thus the temperature of the dummy wafer decreases rapidly.

Next, a back surface temperature T14 of the dummy wafer at a time t13 when a predetermined period of time has elapsed since the flash lamps FL and the halogen lamps HL were turned off is measured with the lower radiation thermometer 20. The back surface temperature T14 of the dummy wafer measured with the lower radiation thermometer 20 at the time t13 is a determination temperature for determining whether or not the temperature of the in-chamber structure such as the susceptor 74 is stabilized.

The dummy wafer is transported from the chamber 6 immediately after the back surface temperature T14 of the dummy wafer is measured at the time t13. The transportation of the dummy wafer from the chamber 6 is performed by the procedure similar to that of the semiconductor wafer W described above.

The heat treatment on one dummy wafer is completed in this manner. The temperature of the in-chamber structure such as the susceptor 74 is hardly stabilized by only transporting one dummy wafer into the chamber 6 at the room temperature and performing the heat treatment by the halogen lamps HL and the flash lamps FL. Thus, in the dummy processing in the present preferred embodiment, the plurality of dummy wafers are transported into the chamber 6 in series and disposed on the susceptor 74 before the first semiconductor wafer W in the lot is transported into the chamber 6, and the heat treatment is performed repeatedly on the plurality of dummy wafers to stabilize the temperature of the susceptor 74, for example. The heat treatment on each of the plurality of dummy wafers is as follows.

Figure 12:
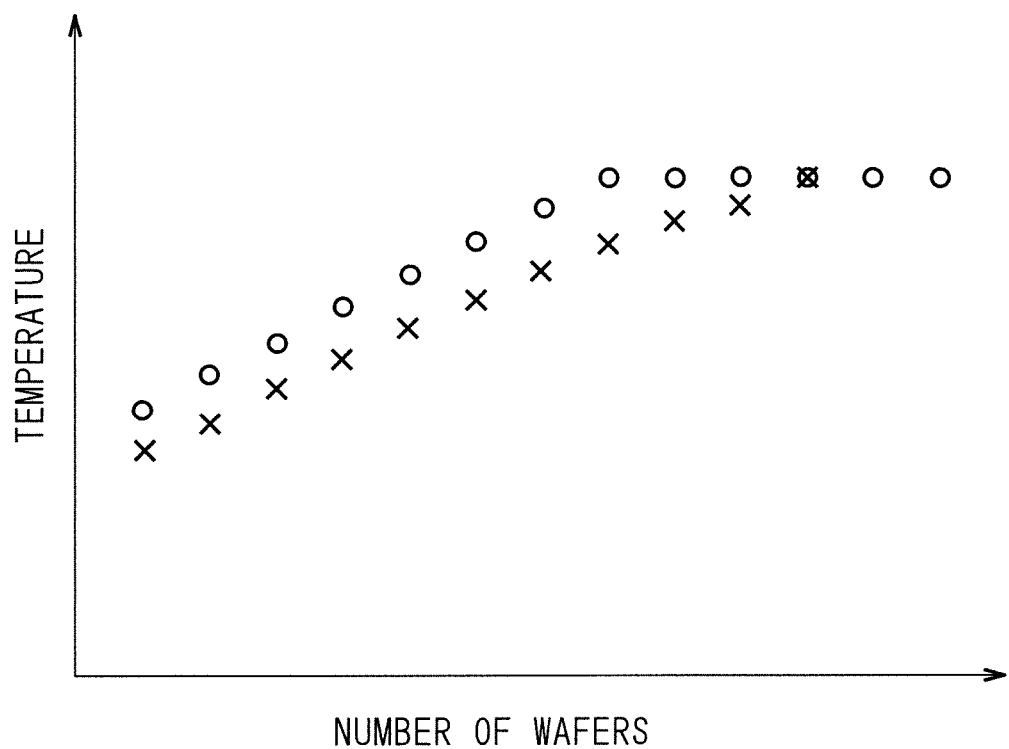
FIG. 12 is a drawing showing a transition of a determination temperature in performing the dummy processing on the plurality of dummy wafers.

FIG. 12 is a drawing showing a transition of a determination temperature in performing the dummy processing on the plurality of dummy wafers. A vertical axis in FIG. 12 indicates the determination temperature. The determination temperature is the back surface temperature T14 measured for each of the plurality of dummy wafers at the time t13. A horizontal axis in FIG. 12 indicates the number of dummy wafers on which the heat treatment has been performed. Crosses in FIG. 12 indicate a comparison example of a case of performing the heat treatment only by the halogen lamps HL (that is to say, a case of not performing the flash irradiation from the flash lamps FL). Circles in FIG. 12 indicate an example of a case of performing the heat treatment by both the halogen lamps HL and the flash lamps FL as with the present preferred embodiment.

As illustrated in FIG. 12, the determination temperature increases as the number of processed dummy wafers increases in an initial stage of the dummy processing. This is caused by reason that the in-chamber structure such as the susceptor 74 is preheated by a heat conduction and a heat radiation from the dummy wafer increased in heat as the number of processed dummy wafers increases, and the temperature of the in-chamber structure also increases. As illustrated in FIG. 12, when the heat treatment is performed by both the halogen lamps HL and the flash lamps FL, the determination temperature becomes constant and is stabilized at the time of performing the heat treatment on the eight dummy wafers. In contrast, when the heat treatment is performed by only the halogen lamps HL, the determination temperature is not stabilized until the heat treatment is performed on the eleven dummy wafers. That is to say, the determination temperature is stabilized earlier when the heat treatment is performed by the flash lamps FL in addition to the halogen lamps HL. Particularly, when the heat treatment is performed on a side of the front surface of the dummy wafer by the flash lamps FL, the temperature of the in-chamber structure provided on the side of the front surface of the dummy wafer can also be efficiently stabilized.

In the present preferred embodiment, the temperature of the in-chamber structure such as the susceptor 74 is considered to reach the stable temperature at a time when the determination temperature is stabilized, and the dummy processing is completed. The processing on the first semiconductor wafer W in the lot is started after the determination temperature becomes constant and is stabilized. In such a manner, the temperature of the in-chamber structure such as the susceptor 74 is stable in the initial semiconductor wafer W and the late semiconductor wafer W in the lot, thus the temperature history can be uniformized.

Performed in the third embodiment is the dummy processing that the plurality of dummy wafers are transported into the chamber 6 in series before the processing on the lot, and the back surface of each dummy wafer is irradiated with light from the halogen lamps HL to heat each dummy wafer, and subsequently the front surface of each dummy wafer is irradiated with the flash of light from the flash lamps FL to heat each dummy wafer. Then, the dummy processing is repeatedly performed until the back surface temperature of the dummy wafer at a time when a predetermined time period has elapsed since the flash lamps FL and the halogen lamps HL were turned off becomes constant. The dummy wafer is heated by the flash irradiation from the flash lamps FL in addition to the irradiation of light from the halogen lamps HL, thus the dummy wafer is heated to a higher temperature and the in-chamber structure such as the susceptor 74 is preheated, and the temperature of the in-chamber structure can be efficiently stabilized in a short time.

Fourth Embodiment

Next, a fourth embodiment according to the present invention will be described. The configuration of the heat treatment apparatus 1 in the fourth embodiment is similar to that of the first embodiment. The procedure of processing the semiconductor wafer W in the fourth embodiment is also the same as that in the first embodiment 1. The stabilization is determined in accordance with the back surface temperature T14 of the dummy wafer at the time t13 in the third embodiment. In contrast, the stabilization is determined in accordance with a maximum achieving temperature (surface achieving temperature) of the front surface of the dummy wafer at a time of the flash irradiation from the flash lamps FL in the fourth embodiment.

The process of the dummy processing in the fourth embodiment is the same as that in the third embodiment. That is to say, the plurality of dummy wafers are transported into the chamber 6 in series before the processing on the lot and disposed on the susceptor 74, and the back surface of each dummy wafer is irradiated with light from the halogen lamps HL to heat each dummy wafer, and subsequently the front surface of each dummy wafer is irradiated with the flash of light from the flash lamps FL to heat each dummy wafer (FIG. 11).

In the fourth embodiment, the maximum achieving temperature of the front surface of the dummy wafer at the time of the flash irradiation to the front surface thereof from the flash lamps FL is measured with the upper radiation thermometer 25. The temperature of the in-chamber structure such as the susceptor 74 is considered to reach the stable temperature at a time when the surface achieving temperature becomes constant and is stabilized, and the dummy processing is completed. Then, the processing on the first semiconductor wafer W in the lot is started.

Figure 13:
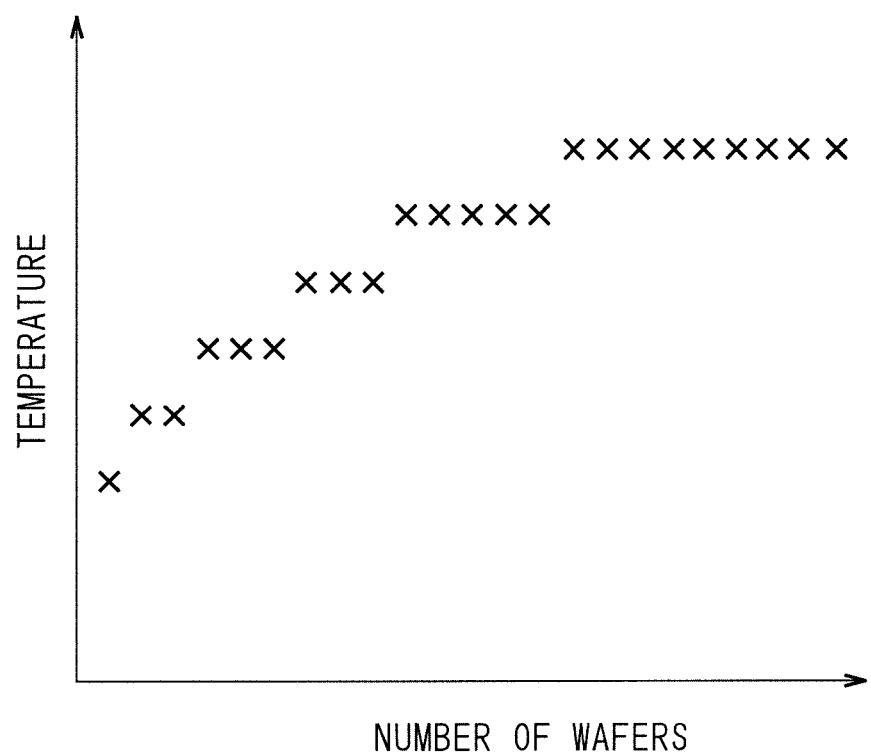
FIG. 13 is a drawing showing a transition of a surface achieving temperature in performing the dummy processing on the plurality of dummy wafers.

FIG. 13 is a drawing showing a transition of a surface achieving temperature in performing the dummy processing on the plurality of dummy wafers. A vertical axis in FIG. 13 indicates the surface achieving temperature. A horizontal axis in FIG. 13 indicates the number of dummy wafers on which the heat treatment has been performed. FIG. 13 shows the surface achieving temperature at the time of flash irradiation from the flash lamps FL after the irradiation of light from the halogen lamps HL. The heat treatment is performed on the plurality of dummy wafers only by the halogen lamps HL before processing the first dummy wafer illustrated in FIG. 13.

As illustrated in FIG. 13, even in the case where the heat treatment is performed on the plurality of dummy wafers only by the halogen lamps HL, when the heat treatment is subsequently performed on the dummy wafer by the halogen lamps HL and the flash lamps FL, the surface achieving temperature gradually increases with increase in the number of processed dummy wafers. This indicates that it is difficult to sufficiently stabilize the temperature of the in-chamber structure such as the susceptor 74 only by the heat treatment by the halogen lamps HL, and the temperature of the in-chamber structure can be reliably stabilized by the heat treatment by using both the halogen lamps HL and the flash lamps FL.

The surface achieving temperature illustrated in FIG. 13 is the temperature of the front surface of the dummy wafer measured with the upper radiation thermometer 25. The lower radiation thermometer 20 receiving radiation through the opening 78 and measuring the temperature of the back surface of the dummy wafer substantially measures only the temperature of the dummy wafer itself, however, in contrast, the upper radiation thermometer 25 measuring the temperature of the front surface of the dummy wafer tends to be influenced by the temperature of the in-chamber structure. In other words, the surface achieving temperature of the dummy wafer measured with the upper radiation thermometer 25 is the temperature in which the influence of the temperature of the in-chamber structure is added.

In the fourth embodiment, the dummy processing is completed at the time when the surface achieving temperature of the dummy wafer becomes constant and is stabilized, and the processing on the first semiconductor wafer W in the lot is started. Accordingly, the first semiconductor wafer W in the lot is processed after the temperature of the in-chamber structure such as the susceptor 74 is stabilized more stably, thus the temperature history of the semiconductor wafer W included in the lot can be further uniformized.

Performed also in the fourth embodiment is the dummy processing that the plurality of dummy wafers are transported into the chamber 6 in series before the processing on the lot, and the back surface of each dummy wafer is irradiated with light from the halogen lamps HL to heat each dummy wafer, and subsequently the front surface of each dummy wafer is irradiated with the flash of light from the flash lamps FL to heat each dummy wafer. Then, in the fourth embodiment, the dummy processing is repeatedly performed until the surface achieving temperature of the dummy wafer at a time of irradiating the dummy wafer with a flash of light from the flash lamps FL becomes constant. The dummy wafer is heated also by the flash irradiation from the flash lamps FL in addition to the irradiation of light from the halogen lamps HL in the manner similar to the third embodiment, thus the dummy wafer is heated to a higher temperature and the in-chamber structure such as the susceptor 74 is preheated, and the temperature of the in-chamber structure can be efficiently stabilized in a short time.

Modification Example

While the preferred embodiments according to the present invention have been described hereinabove, various modifications of the present invention are possible in addition to those described above without departing from the scope and spirit of the present invention. For example, in the first embodiment, the decreasing temperature is calculated based on the measurement temperature of the lower radiation thermometer 20, however, this process is not necessary, thus the decreasing temperature may be calculated based on the measurement temperature of the susceptor thermometer 91 or the atmospheric thermometer 95. That is to say, it is also applicable that the temperature of the susceptor 74 is measured with the susceptor thermometer 91 after the preceding wafer is transported from the chamber 6 and a difference of the temperature of the susceptor 74 decreasing from the time t2 to the time t3 is determined as the decreasing temperature. Alternatively, it is also applicable that the atmospheric temperature within the chamber 6 is measured with the atmospheric thermometer 95 after the preceding wafer is transported from the chamber 6 and a difference of the atmospheric temperature therein decreasing from the time t2 to the time t3 is determined as the decreasing temperature. In any case, when the decreasing temperature is larger than a predetermined threshold value, the dummy processing is executed, and when the decreasing temperature is equal to or smaller than the predetermined threshold value, processing on the subsequent wafer is started without performing the dummy processing. Accordingly, the number of consumed dummy wafers can be reduced while the temperature history after the processing on the subsequent wafer is prevented from being un-uniformized in the manner similar to the first embodiment.

For example, the stabilization is determined based on the back surface temperature of the dummy wafer in the third embodiment, and the stabilization is determined based on the surface achieving temperature of the dummy wafer in the fourth embodiment, however, the stabilization may also be determined based on both of them. That is to say, it is also applicable that the dummy processing is repeatedly performed until both the back surface temperature of the dummy wafer at a time when a predetermined time period has elapsed since the flash lamps FL and the halogen lamps HL were turned off and the surface achieving temperature of the dummy wafer at a time of irradiating the dummy wafer with a flash of light from the flash lamps FL become constant. In such a manner, the processing on the first semiconductor wafer W in the lot can be started after the temperature of the in-chamber structure such as the susceptor 74 is stabilized more reliably.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiments, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as continuous lighting lamps to perform the preheating. The substrate to be treated by the heat treatment apparatus 1 is not limited to the semiconductor wafer, but a glass substrate used for a flat panel display in a liquid crystal display device, for example, or a substrate for a solar cell are also applicable.

While the invention has been shown and described in detail, the foregoing 5 description is in all aspects illustrative and not restrictive. It is therefore understood that numerous modifications and variations can be devised without departing from the scope of the invention.

What is claimed is:

1. A heat treatment method of heating a substrate by irradiating the substrate with light, comprising:
    a step (a) of measuring a temperature within a chamber to obtain a measurement temperature, said measurement temperature being obtained at a time when a processing start request for a subsequent substrate is detected, and after processing on a preceding substrate has finished and the preceding substrate is transported from the chamber, thereby enabling processing a plurality of substrates;
    a step (b) of calculating a decreasing temperature by calculating a difference between a previously obtained transportation temperature and said measurement temperature obtained in step (a), said transportation temperature is a temperature that existed within the chamber when the preceding substrate was transported from the chamber; and
    a step (c) of comparing the decreasing temperature calculated in the step (b) with a predetermined threshold value; and
    executing a dummy processing, when the decreasing temperature is larger than the threshold value, said dummy processing comprising preheating a structure within the chamber by light irradiation from continuous lighting lamps and flash lamps, and when the decreasing temperature is equal to or smaller than the threshold value, transporting into the chamber a subsequent substrate without executing the dummy processing to start processing on the subsequent substrate.

2. The heat treatment method according to claim 1, wherein
    in the dummy processing, a dummy wafer is transported into the chamber, and the dummy wafer is irradiated with light from the continuous lighting lamps and the flash lamps to preheat the structure within the chamber.

3. The heat treatment method according to claim 2, wherein each condition of irradiating the dummy wafer with light from the continuous lighting lamps and the flash lamps is defined as a first condition and a second condition, and in the dummy processing, the dummy wafer is irradiated with light from the continuous lighting lamps in the first condition, and is irradiated with light from the flash lamps in the second condition.

4. The heat treatment method according to claim 1, wherein in the dummy processing, a dummy wafer is not transported into the chamber, but the structure within the chamber is irradiated with light from the continuous lighting lamps and the flash lamps to preheat the structure within the chamber.

5. The heat treatment method according to claim 1, wherein in the step (a), a temperature of a susceptor holding that serves to hold substrates being processed is measured with a susceptor thermometer.

6. The heat treatment method according to claim 1, wherein in the step (a), a temperature of an atmosphere within the chamber is measured with an atmospheric thermometer.

7. The heat treatment method according to claim 1, wherein in the step (a), a temperature within the chamber is measured with a radiation thermometer measuring a temperature of a lower surface of substrates being processed.

* * * * *